US010510732B2

(12) United States Patent
Tsou et al.

(10) Patent No.: US 10,510,732 B2
(45) Date of Patent: Dec. 17, 2019

(54) POP DEVICE AND METHOD OF FORMING THE SAME

(71) Applicant: Taiwan Semiconductor Manufacturing Co., Ltd., Hsinchu (TW)

(72) Inventors: Hsien-Ju Tsou, Taipei (TW); Chih-Wei Wu, Yilan County (TW); Jing-Cheng Lin, Hsinchu (TW); Pu Wang, Hsinchu (TW); Szu-Wei Lu, Hsinchu (TW); Ying-Ching Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 12 days.

(21) Appl. No.: 15/854,755

(22) Filed: Dec. 27, 2017

(65) Prior Publication Data

US 2019/0103387 A1   Apr. 4, 2019

Related U.S. Application Data

(60) Provisional application No. 62/566,337, filed on Sep. 30, 2017.

(51) Int. Cl.
| | |
|---|---|
| *H01L 25/10* | (2006.01) |
| *H01L 25/00* | (2006.01) |
| *H01L 21/48* | (2006.01) |
| *H01L 23/00* | (2006.01) |
| *H01L 23/538* | (2006.01) |

(52) U.S. Cl.
CPC .......... *H01L 25/105* (2013.01); *H01L 21/481* (2013.01); *H01L 21/486* (2013.01); *H01L 23/5384* (2013.01); *H01L 23/5389* (2013.01); *H01L 24/16* (2013.01); *H01L 24/97* (2013.01); *H01L 25/50* (2013.01); *H01L 2224/16225* (2013.01); *H01L 2225/1035* (2013.01); *H01L 2225/1041* (2013.01); *H01L 2225/1058* (2013.01)

(58) Field of Classification Search
CPC ............. H01L 23/5389; H01L 23/5384; H01L 2225/1058; H01L 2224/16225; H01L 25/105; H01L 24/97; H01L 21/481; H01L 25/50; H01L 21/486; H01L 2225/1041; H01L 24/16
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Laura M Menz
*Assistant Examiner* — Candice Chan
(74) *Attorney, Agent, or Firm* — JCIPRNET

(57) ABSTRACT

Provided are a PoP device and a method of manufacturing the same. The PoP device includes a first package structure and a second package structure. The first package structure includes a die, a through integrated fan-out via (TIV), an encapsulant, and a film. The TIV is aside the die. The encapsulant encapsulates sidewalls of the die and sidewalls of the TIV. The film is over the TIV and the encapsulant, and aside the die. The second package structure is connected to the first package structure through a connector. The connector penetrates through the film to electrically connected to the TIV.

20 Claims, 18 Drawing Sheets

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2010/0148360 A1* | 6/2010 | Lin .................... H01L 21/6835 257/737 |
| 2014/0210101 A1* | 7/2014 | Lin ........................ H01L 24/19 257/774 |
| 2014/0252646 A1* | 9/2014 | Hung ................... H01L 23/481 257/774 |

* cited by examiner

POP DEVICE AND METHOD OF FORMING THE SAME

CROSS-REFERENCE TO RELATED APPLICATION

This application claims the priority benefit of U.S. provisional application Ser. No. 62/566,337, filed on Sep. 30, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

DETAILED DESCRIPTION

Figure 1A:
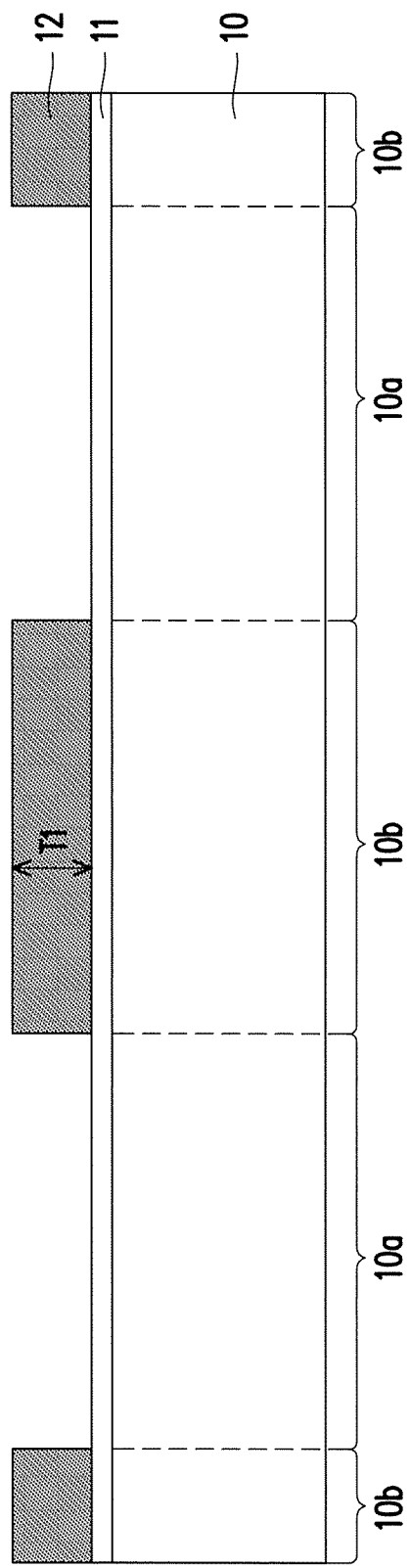
FIG. 1A to FIG. 1H are schematic cross-sectional views illustrating a method of forming a PoP device according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 6:
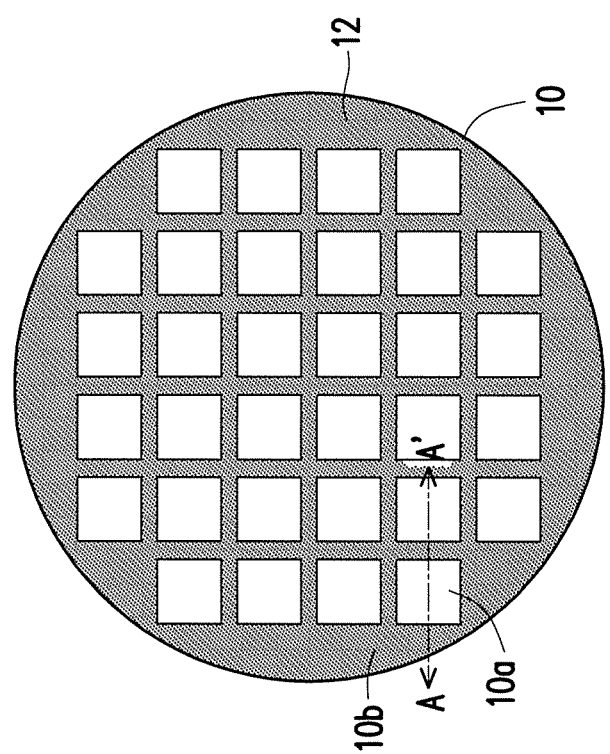
FIG. 6 is a top view illustrating a film on a carrier according to some embodiments of the disclosure.

FIG. 1A to FIG. 1H are schematic cross-sectional views illustrating a method of forming a PoP device according to some embodiments of the disclosure. FIG. 6 is a top view illustrating a film on a carrier according to some embodiments of the disclosure. In some embodiments, FIG. 1A is the schematic cross-sectional view along A-A' line of FIG. 6.

Referring to FIG. 1A and FIG. 6, a carrier 10 is provided. The carrier 10 may be a glass carrier, a ceramic carrier, or the like. In some embodiments, the carrier 10 has a de-bonding layer 11 formed thereon. The de-bonding layer 11 is formed by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

In some embodiments, the carrier 10 includes a plurality of die regions 10a, and a plurality of peripheral regions 10b aside the die regions 10a. The die regions 10a are the regions for attaching dies thereon in the subsequent process. The other regions of carrier 10 are the peripheral regions 10b. In some embodiments, the die regions 10a are surrounded and separated by the peripheral regions 10b. In other words, the die regions 10a and the peripheral regions 10b are arranged alternately.

Still referring to FIG. 1A, a film 12 is formed on the de-bonding layer 11 over the carrier 10. In some embodiments, the film 12 is a laminated film. The film 12 is formed over the peripheral region 10b of the carrier 10, and exposes the die region 10a of the carrier 10. In some embodiments, the sidewalls of the film 12 are straight, but the disclosure is not limited thereto. In some other embodiments, the sidewalls of the film 12 may be inclined or any other shape, as long as the film 12 has a suitable thickness for subsequent processes. In some embodiments, the thickness T1 of the film 12 ranges from 30 µm to 50 µm.

In some embodiments, the film 12 includes an inorganic material, an organic material, or a combination thereof. The inorganic material includes inorganic dielectric material, such as, silicon oxide, silicon nitride, silicon oxynitride, or a combination thereof. The organic material includes organic dielectric material. The organic dielectric material includes polymer such as photosensitive polymer material, non-photosensitive polymer material, or a combination thereof. The organic dielectric material includes, for example, polybenzoxazole (PBO), polyimide (PI), PI base material, benzocyclobutene (BCB), Ajinomoto buildup film (ABF), epoxy, or a combination thereof, and/or the like.

In some embodiments, the film 12 may be formed by forming a film material layer on the carrier 10 by a suitable fabrication technique, such as spin coating process, chemical vapor deposition (CVD), or the like. The film material layer covers the top surface of the de-bonding layer 11. Thereafter, the film material layer is patterned by a photolithography process and an etching process. In some embodiments, after the film material layer is formed by a spin coating process or CVD, a planarization process such as a chemical mechanical polishing (CMP) process is further performed to planarize the surface of the film material layer. In some other embodiments, a film material layer is provided. The film material layer has a same shape as the carrier 10, for example. The film material layer is then patterned by a suitable process, such as a mechanical punching process. Thereafter, the punched film material layer is pasted or attached on the de-bonding layer 11 over the carrier 10. In some embodiments, the process of attaching the punched film material layer on the carrier 10 is accompanied with a heating process.

Figure 1B:
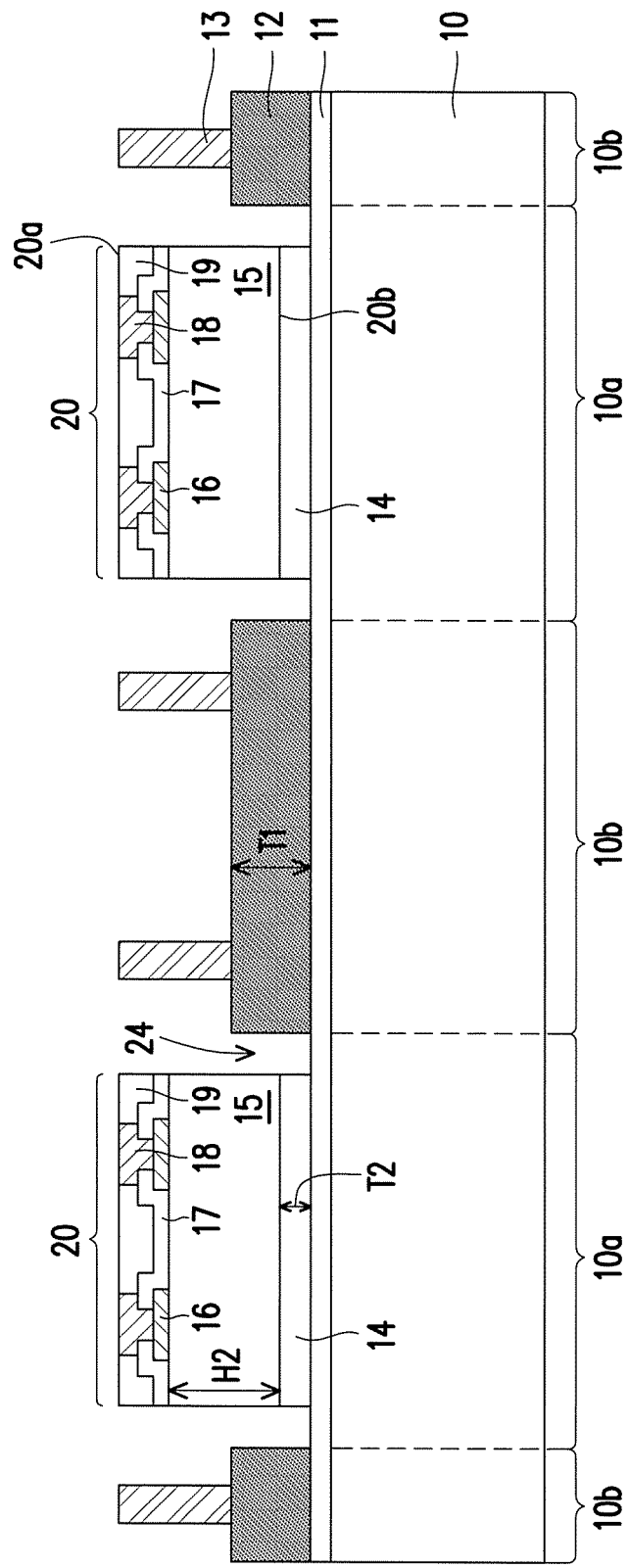

Referring to FIG. 1B, a plurality of through integrated fan-out vias (TIVs) 13 are formed on the film 12. In some embodiments, the TIVs 13 include copper, nickel, solder, alloys thereof, or the like. In some embodiments, the TIV 13 includes a seed layer and a conductive layer formed thereon (not shown). The seed layer is a copper seed layer or other metal seed layer. In some embodiments, the seed layer is for example, a titanium or/and copper composited layer. The conductive layer is, for example, a copper layer or other suitable metal layer. An exemplary forming method of the TIVs 13 includes forming a seed layer on the de-bonding layer 11 and the film 12 by, for example, physical vapor deposition. A photoresist layer is then formed on the seed layer. Thereafter, openings are formed in the photoresist layer, the openings expose a portion of the top surface of the seed layer on the film 12, and a conductive layer is then formed in the openings by electroplating. Thereafter, the photoresist layer is removed, and the seed layer not covered by the conductive layer is removed by an etching process with the conductive layer as a mask. The conductive layer and the underlying seed layer form the TIV 13. In some other embodiments, the TIVs 13 further include a barrier layer (not shown) under the seed layer to prevent metal diffusion. The material of the barrier layer includes, for instance, metal nitride such as titanium nitride, tantalum nitride, or a combination thereof.

Still referring to FIG. 1B, two dies 20 are mounted on the die regions 10a of the carrier 10 through an adhesive layer 14 such as a die attach film (DAF), silver paste, or the like. In some embodiments, the die 20 is one of a plurality of dies cut apart from a wafer, for example. The die 20 may be an application-specific integrated circuit (ASIC) chip, an analog chip, a sensor chip, a wireless and radio frequency chip, a voltage regulator chip or a memory chips. The number of the die 20 shown in FIG. 1B is merely for illustration, and the disclosure is not limited thereto. In some embodiments, one die 20 or more than two dies 20 may be mounted over the carrier 10, and the dies 20 may be the same types of dies or the different types of dies.

The die 20 is disposed between the film 12 and the TIVs 13, that is, the film 12 and the TIVs 13 are aside or around the die 20. In some embodiments, the die 20 and the film 12 are not in contact with each other, and a gap 24 is existed between the die 20 and the film 12, but the disclosure is not limited thereto.

In some embodiments, the die 20 includes a substrate 15, a plurality of pads 16, a passivation layer 17, a plurality of connectors 18 and a passivation layer 19. The pads 16 may be a part of an interconnection structure (not shown) and electrically connected to the integrated circuit devices (not shown) formed on the substrate 15. The passivation layer 17 is formed over the substrate 15 and covers a portion of the pads 16. A portion of the pads 16 is exposed by the passivation layer 17 and serves as an external connection of the die 20. The connectors 18 are formed on and electrically connected to the pads 16 not covered by the passivation layer 17. The connector 18 includes solder bumps, gold bumps, copper bumps, copper posts, copper pillars, or the like. The passivation layer 19 is formed over the passivation layer 17 and aside the connectors 18 to cover the sidewalls of the connectors 18. The passivation layers 17 and 19 respectively include an insulating material such as silicon oxide, silicon nitride, polymer, or a combination thereof. The materials of the passivation 17 and the passivation layer 19 may be the same or different. In some embodiments, the top surface of the passivation layer 19 is substantially level with the top surface of the connectors 18.

The die 20 has a first surface 20a (or referred as front surface) and a second surface 20b (or referred as back surface) opposite to each other. The first surface 20a is an active surface of the die 20. In some embodiments, the first surface 20a is formed of the top surface of the passivation layer 19 and the top surfaces of the connectors 18, and the second surface 20b is a surface of the substrate 15. In some embodiments, the height (or referred as thickness) from the first surface 20a to the second surface 20b of the die 20 is about 200 μm. The height H2 of the substrate 15 of the die 20 ranges from 120 μm to 250 μm, or from 150 μm to 180 μm, for example.

Still referring to FIG. 1B, the bottom surface of the adhesive layer 14 is coplanar with the bottom surface of the film 12. In some embodiments, the thickness T2 of the adhesive layer 14 is about 10 μm. That is to say, the thickness T2 of the adhesive layer 14 is less than the thickness T1 of the film 12. In other word, the second surface 20b of the die 20 is lower than the bottom surface of the TIV 13. The first surface 20a of the die 20 may be level with or lower than the top surface of the TIV 13.

Figure 1C:
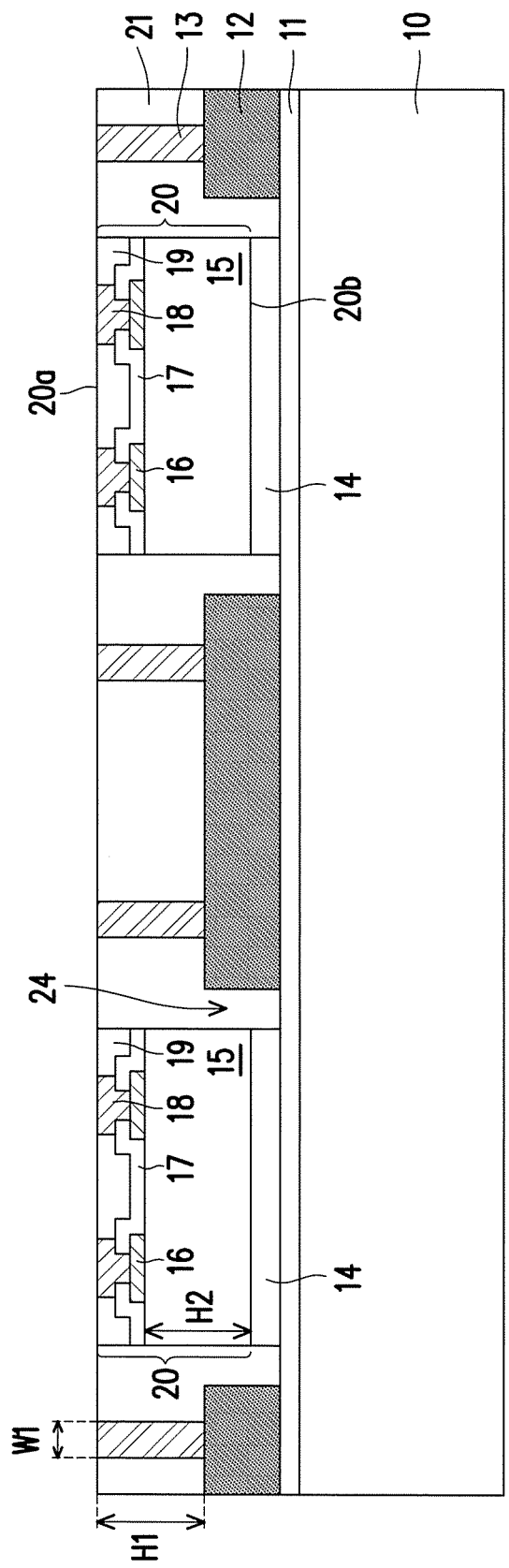

Referring to FIG. 1C, an encapsulant 21 is formed over the carrier 10 and on the film 12, and aside the dies 20, the TIVs 13, encapsulating the sidewalls of the dies 20 and the sidewalls of the TIVs 13. In some embodiments in which the gap 24 is existed between the die 20 and the film 12, the encapsulant 21 fills in the gap 24, and covers a portion of the top surface and the sidewalls of the film 12. That is, a portion of the encapsulant 21 is between the die 20 and the film 12, and between the adhesive layer 14 and the film 12. The bottom surface of the encapsulant 21 is coplanar with the bottom surface of the film 12.

The material of the encapsulant 21 may be the same as or different from the material of the film 12. In some embodiments, the encapsulant 21 includes a molding compound, a molding underfill, a resin such as epoxy, a combination thereof, or the like. In some other embodiments, the encapsulant 21 includes a photo-sensitive material such as PBO, PI, BCB, a combination thereof, or the like, which may be easily patterned by exposure and development processes or laser drilling process. In alternative embodiments, the encapsulant 21 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 21 is formed by forming an encapsulant material layer over the carrier 10 by a suitable fabrication technique such as spin-coating, lamination, deposition, or similar processes. The encapsulant material layer encapsulates the first surfaces 20a and sidewalls of the die 20 and the top surfaces and sidewalls of the TIVs 13. Thereafter, a planarization process such as a grinding or polishing process is performed to remove a portion of the encapsulant material layer, such that the first surfaces of the dies 20 and the top surfaces of the TIVs 13 are exposed. In some embodiments in which the first surface 20a of the die 20 is level with the top surface of the TIV 13, only a portion of the encapsulant material layer is removed during the planarization process. In some embodiments in which the first surface 20a of the die 20 is lower than the top surfaces of the TIVs 13, portions of the TIVs 13 are also removed during the planarization process. In some embodiments, the first surfaces of the dies 20, the top surfaces of TIVs 13 and the top surface of the encapsulant 21 are substantially coplanar with each other.

Still referring to FIG. 1C, in some embodiments, the width W1 (or referred as diameter) of the TIV 13 ranges from 30 μm to 240 μm. The height H1 of the TIV 13 is less than the height of the die 20 from the first surface 20a to the second surface 20b. In some embodiments, the TIV 13 is a pillar, and the height H1 of the TIV 13 ranges from 190 μm to 220 μm. The sidewall of the TIV 13 may be straight or inclined.

Figure 1D:
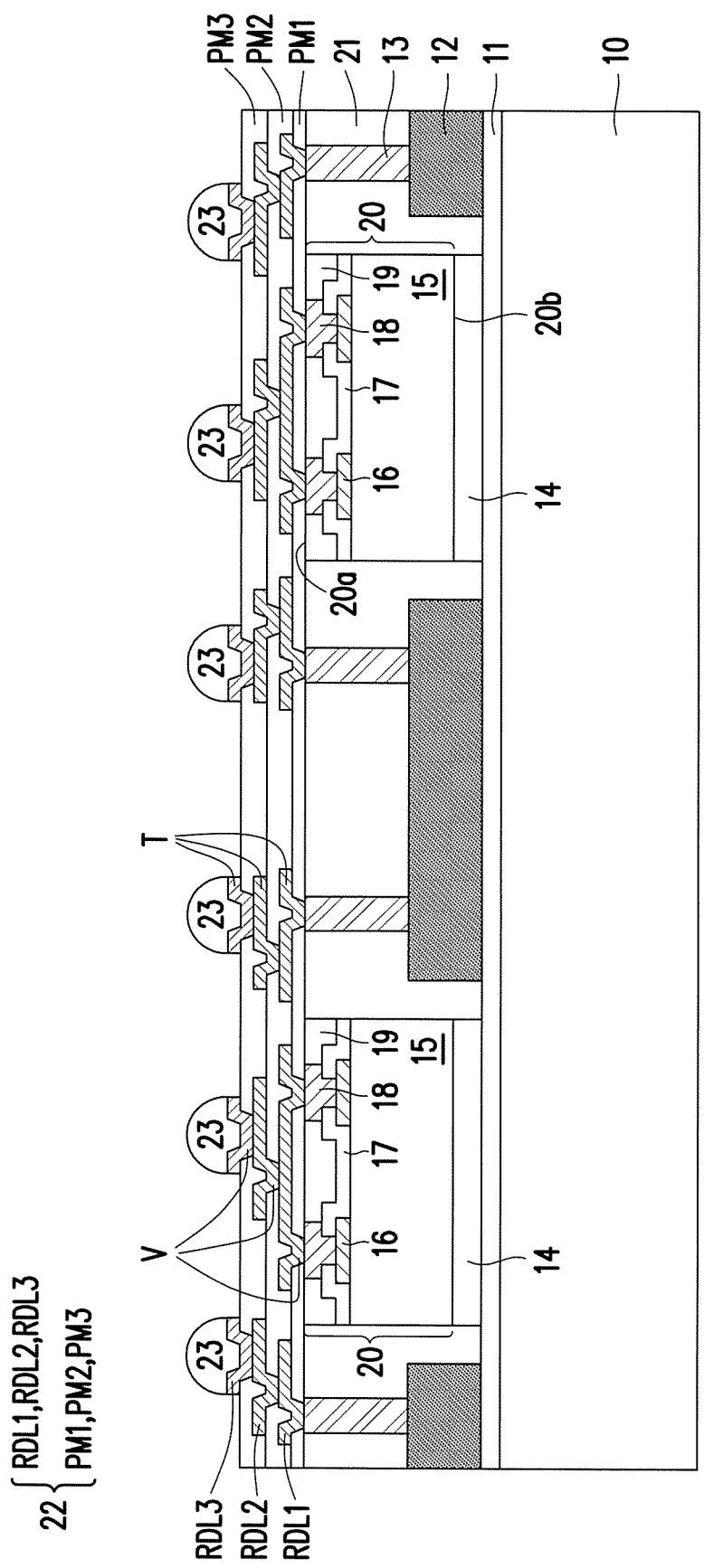

Referring to FIG. 1D, a redistribution layer (RDL) structure 22 is formed on and electrically connected to the dies 20 and the TIVs 13. The RDL structure 22 is referred as a front-side redistribution layer structure. In some embodiments, the two dies 20 are not electrically connected to each other through the RDL structure 22, but electrically isolated. However, the disclosure is not limited thereto. In some other embodiments, the two dies 20 are electrically connected to each other through the RDL structure 22. In the embodiments in which the two dies 20 are electrically connected through the RDL structure 22, TIVs 13 may be or not be formed between the two dies 20.

In some embodiments, the RDL structure 22 includes a plurality of polymer layers PM1, PM2, PM3 and a plurality of redistribution layers RDL1, RDL2, RDL3 stacked alternately. The number of the polymer layers or the redistribution layers shown in FIG. 1D is merely for illustration, and is not limited thereto. The redistribution layer RDL1 penetrates through the polymer layer PM1 and is electrically connected to the connectors 18 of the die 20 and the TIVs 13. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The polymer layers PM1, PM2, PM3 may include a material the same as or different from the material of the film 12. In some embodiments, each of the polymer layers PM1, PM2 and PM3 includes a photo-sensitive material such as PBO, PI, BCB, a combination thereof or the like. In some embodiments, each of the redistribution layers RDL1, RDL2 and RDL3 includes conductive materials. The conductive materials includes metal such as copper, nickel, titanium, a combination thereof or the like, and is formed by an electroplating process. In some embodiments, the redistribution layers RDL1, RDL2 and RDL3 respectively includes a seed layer (not shown) and a metal layer formed thereon (not shown). The seed layer may be a metal seed layer such as a copper seed layer. The metal layer may be copper or other suitable metals.

In some embodiments, the redistribution layers RDL1, RDL2 and RDL3 respectively includes a plurality of vias V and a plurality of traces T connected to each other. The vias V penetrate through the polymer layers PM1, PM2, PM3 to connect the traces T of the redistribution layers RDL1, RDL1, RDL3, and the traces T are respectively located on the polymer layers PM1, PM2, PM3, and are respectively extending on the top surface of the polymer layers PM1, PM2, PM3.

In some embodiments, the redistribution layer RDL3 is the topmost redistribution layer of the RDL structure 22, and is referred as an under-ball metallurgy (UBM) layer for ball mounting. A plurality of connectors 23 are formed on the redistribution layer RDL3 of the RDL structure 22. In some embodiments, the connectors 23 are referred as conductive terminals. The connectors 23 are electrically connected to the dies 20 through the RDL structure 22. In some embodiments, the connectors 23 are made of a conductive material with low resistivity, such as Sn, Pb, Ag, Cu, Ni, Bi or an alloy thereof, and are formed by a suitable process such as ball placement process and reflow process. In alternative embodiments, the connectors 23 may be controlled collapse chip connection (i.e. C4) bumps formed by a C4 process.

Figure 1E:
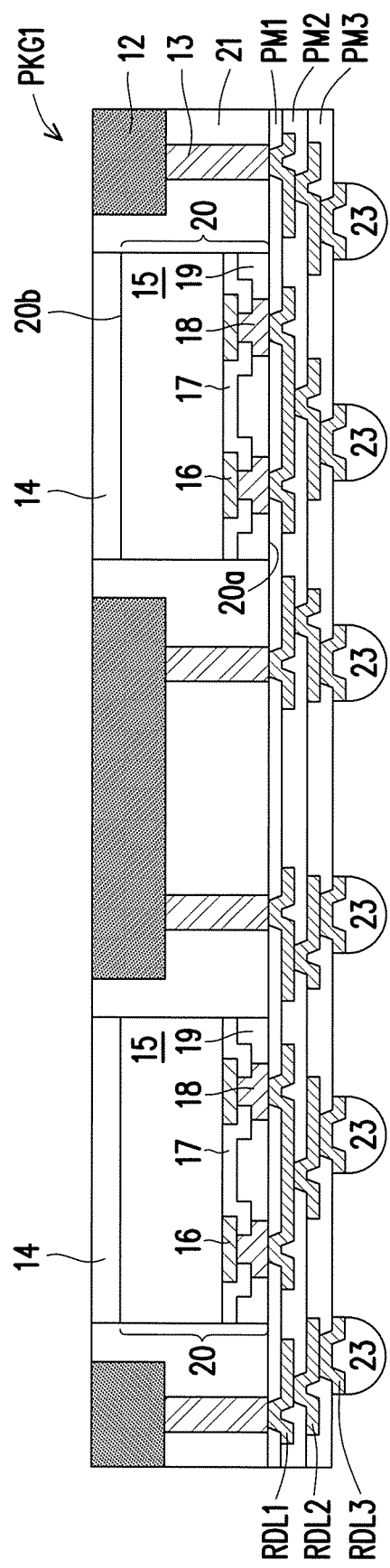

Referring to FIG. 1D and FIG. 1E, the structure formed in FIG. 1D is turned over, the de-bonding layer 11 is decomposed under the heat of light, and the carrier 10 is then released from the structure. A package structure PKG1 is thus completed.

Referring to FIG. 1E, the package structure PKG1 includes the dies 20, the film 12, the TIVs 13, the encapsulant 21, the RDL structure 22 and the connectors 23. The second surface 20b of the die 20 is covered by the adhesive layer 14. In some embodiments, the top surface of the film 12, the top surface of the encapsulant 21, the top surface of the adhesive layer 12 are exposed, and are substantially coplanar with each other.

Figure 1F:
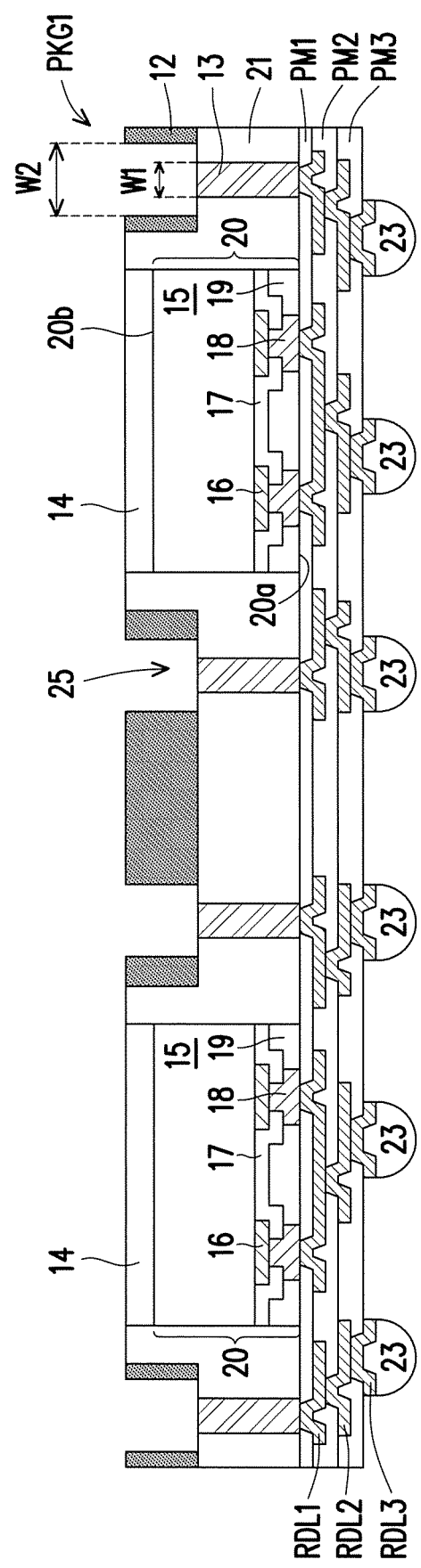

Referring to FIG. 1E and FIG. 1F, at least a portion of the film 12 over the TIVs 13 is removed by a laser drilling process, for example, and a plurality of recesses 25 (or referred as openings) are formed in the film 12 and over the TIVs 13, at least exposing portions of the top surfaces of the TIVs 13. In some embodiments, the recesses 25 expose the top surfaces of the TIVs 13 or/and a portion of the top surface of the encapsulant 21. The cross-section shape of the recess 25 may be square, rectangle or inverted trapezoid, for example. The sidewalls of the recess 25 may be straight or inclined. The width W2 (or referred as the bottom width) of the recess 25 may be less than, equal to, or larger than the width W1 of the TIV 13. In some embodiments in which the width W2 of the recess 25 is larger than the width W1 of the TIV 13, and the material of the film 12 is different from the material of the encapsulant 21, the encapsulant 21 serves as a stop layer during the laser drilling process.

In some embodiments, a portion of the film 12 is removed, and another portion of the film 12 over the TIV 13 is remained, and the sidewalls of the recess 25 expose the film 12 as shown in FIG. 1F.

In some other embodiments, the film 12 on the TIV 13 may be completed removed, and the sidewalls of the recess 25 expose the encapsulant 21 (not shown).

Figure 1G:
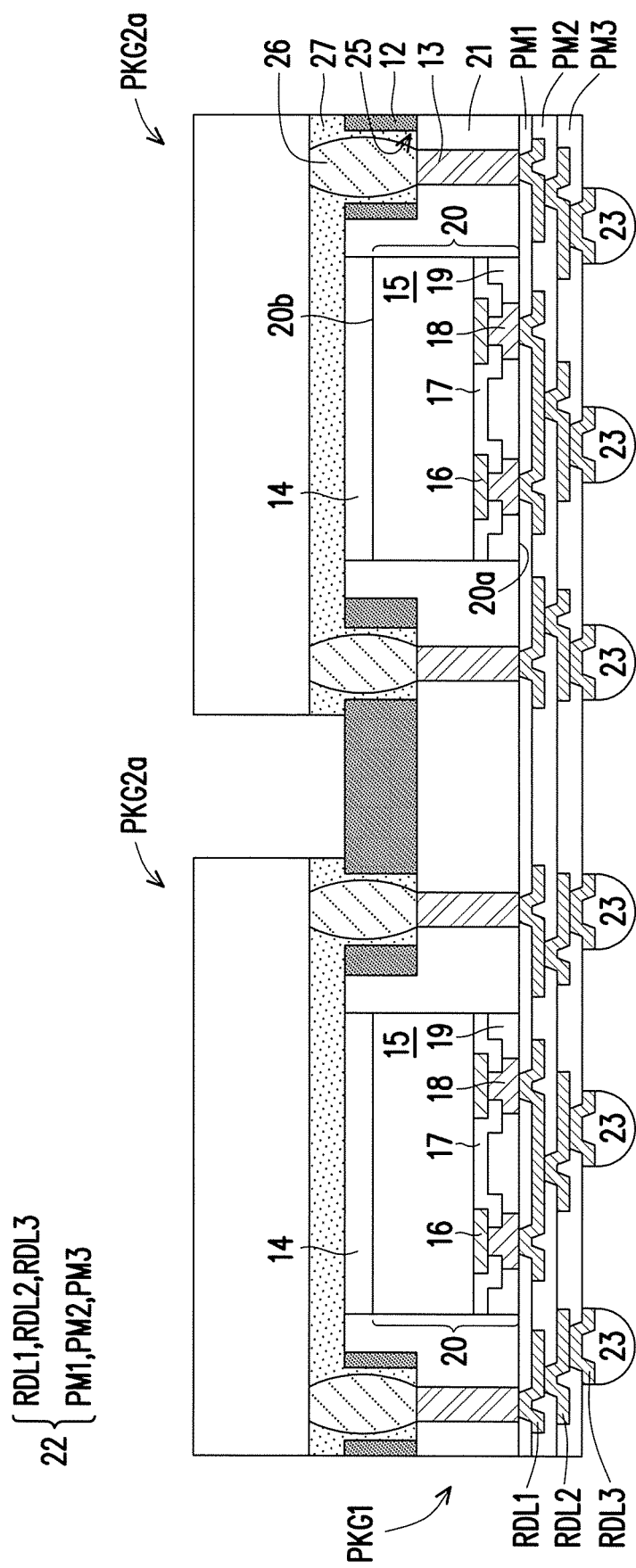

Referring to FIG. 1G, one or more package structures PKG2a are bonded to the package structure PKG1 though a plurality of connectors 26. The package structure PKG2a and the package structure PKG1 may include the same types of devices or the different types of devices. The package structure PKG2a may include an active device or a passive device. In some embodiments, the package structure PKG2a is a memory, such as dynamic random access memory (DRAM), static random access memory (SRAM), or other type of memory. In some embodiments in which a plurality of package structures PKG2a are bonded to the package structure PKG1, the plurality of package structures PKG2a may include the same types of devices or the different types of devices.

The connectors 26 fill into the recesses 25 to be in electrical contact with the TIVs 13 of the package structure PKG1, such that the package structure PKG1 and the package structure PKG2a are electrically connected to each other. The material of the connector 26 is different from or the same as the material of the TIV 13. In some embodiments, the connectors 26 are metal bumps or metal balls, such as solder bumps, for example. The connector 26 may be formed by a ball drop process and a reflow process. The size (referred to height and width) of the connector 26 is dependent on the size (referred to diameter) of the TIV 13. An interface is existed between the connector 26 and the TIV 13, and is lower than the second surface 20b of the die 20. In some embodiments, the connector 26 has a different shape or profile from that of the TIV 13. The cross-section shape of the connector 26 includes a vase-liked shape, a racetrack-liked shape, for example. In some embodiments, the sidewalls of the connector 26 are arc-shaped, the width of the connector 26 increases gradually and then decreases gradually from top to bottom. That is, the connector 26 has a widest width at its middle region from top to bottom. In some embodiments, the bottom width of the connector 26 is less than, equal to, or greater than the width of the TIV 13, that is, the top surface of the TIV 13 may be partially or completely covered by and in contact with the connector 26.

In some embodiments, the package structure PKG2a and the package structure PKG1 has a space therebetween. An underfill layer 27 is formed to fill the space between the package structure PKG1 and the second package structure PKG2a and surround the connectors 26.

Figure 1H:
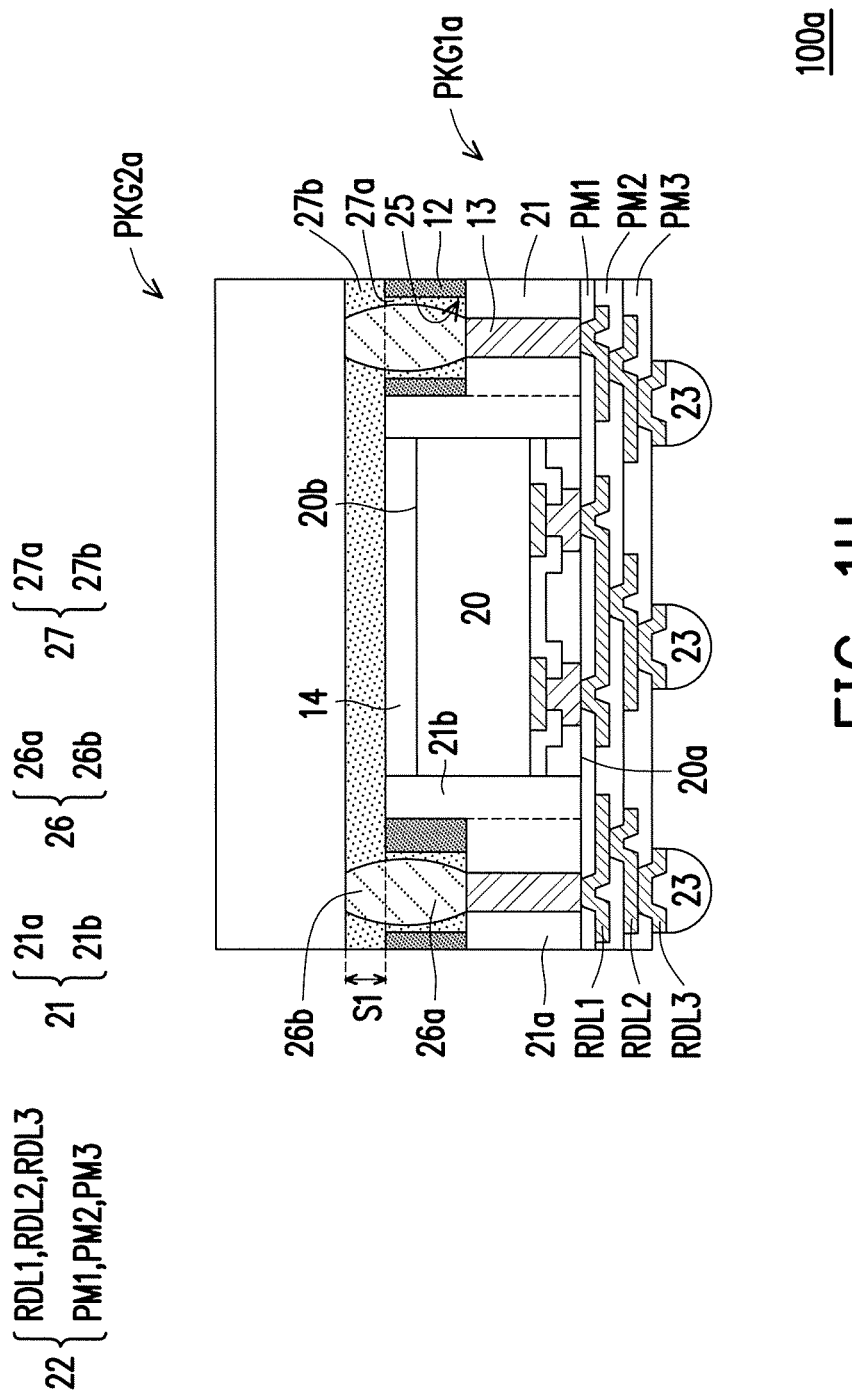

Referring to FIG. 1G and FIG. 1H, in some embodiments in which a plurality of dies 20 are formed on the carrier 10, and the dies 20 are electrically isolated from each other, the number of the package structures PKG2a is the same as the number of the dies 20. After the package structures PKG2a are bonded to the package structure PKG1, a die-saw process is then performed, and the structure formed in FIG. 1G is singulated. Specifically, the package structure PKG1 is singulated, and a package structure PKG1a having one die 20 is formed.

Referring to FIG. 1H, a package-on-package (PoP) device 100a is thus completed. The PoP device 100a includes the package structure PKG1a, the package structure PKG2a, the connectors 26, and the underfill layer 27. The package structure PKG1a and the package structure PKG2a are electrically connected to each other through the connectors 26. The underfill layer 27 is disposed to fill the space between the package structure PKG1a and the package structure PKG2a, and surround the connectors 26.

The package structure PKG1a includes the die 20, the adhesive layer 14 on the die 20, the TIVs 13, the encapsulant 21, the film 12, the RDL structure 22 and the connectors 23. The adhesive layer 14 is located between the die 20 and the underfill layer 27. In some embodiments, the top surface of the adhesive layer 14, the top surface of the film 12, and the top surface of the encapsulant 21 are substantially coplanar with each other, and are in contact with the underfill layer 27.

The TIVs 13 are located aside the die 20, and the sidewalls of the TIVs 13 are encapsulated by the encapsulant 21. The top surfaces of the TIVs 13 are lower than the top surface of the adhesive layer 14. In some embodiments, the top surfaces of the TIVs 13 are also lower than the second surface 20b (that is, the top surface) of the die 20.

The encapsulant 21 is located aside the die 20 and the TIVs 13, encapsulating sidewalls of the die 20 and sidewalls of the TIVs 13. In some embodiments, the encapsulant 21 has a stepped structure, and includes a first portion 21a and a second portion 21b connected to each other. The first portion 21a encapsulates the sidewalls of the TIVs 13. The second portion 21b is between the first portion 21a and the die 20, and encapsulates the sidewalls of the die 20. The top surface of the second portion 21b is coplanar with the top surface of the adhesive layer 14 and the top surface of the film 12, and is in contact with the underfill layer 27. The top surface of the first portion 21a is lower than the top surface of the second portion 21b. The top surface of the first portion 21a is coplanar with the top surface of the TIV 13, and is lower than the top surface of the adhesive layer 14. In some embodiments, the top surface of the first portion 21a is also lower than the second surface 20b (that is, the top surface) of the die 20. In some embodiments, the top surface of the first portion 21a is covered by and in contact with the underfill layer 27 and the film 12. In some other embodiments in which the film 12 is completely removed, the top surface of the first portion 21a is covered by and in contact with the underfill layer 27, and not covered by the film 12. In other words, the top surface of the first portion 21a is covered by and in contact with the underfill layer 27 only.

The film 12 is located over the first portion 21a of the encapsulant 21 and the TIVs 13, and aside the second portion 21b of the encapsulant 21. In other words, the film 12 has a plurality of recesses 25, at least exposing portions of the top surfaces of the TIVs 13. In some embodiments, the film 12 is not in contact with the die 18, but separated from the die 18 by the second portion 21b of the encapsulant 21.

The connectors 26 penetrates through the film 12, and are in electrical contact with the TIVs 13 of the package structure PKG1a. Specifically, the connector 26 fills in a portion of the recess 25 of the film 12, and contacts with the top surface of the TIV 13 exposed by the recess 25. A portion of the connector 26 is in the recess 25, and aside the die 20 and the encapsulant 21. The bottom surface of the connector 26 is in contact with the top surface of the TIV 13, and is lower than the top surface of the adhesive layer 14, lower than the top surface of the second portion 21b of the encapsulant 21, and lower than the second surface 20b (that is, top surface) of the die 20.

The connector 26 is covered and laterally surrounded by the underfill layer 27. Specifically, the connector 26 includes an embedded part 26a and a protruding part 26b. The embedded part 26a is located in the recess 25 of the package structure PKG1a, and surrounded by the underfill layer 27, the film 12, and the encapsulant 21. The protruding part 26b of the connector 26 is on the embedded part 26a, and protrudes from the top surface of the package structure PKG1a. In other words, the protruding part 26b of the connector 26 is located between the package structure PKG2a and the package structure PKG1a. In some embodiments, the height of the embedded part 26a and the height of the protruding part 26b may be adjusted by controlling the depth of the recess 25 or the thickness of the film 12. The height of the embedded part 26a may be less than, equal to, or larger than the height of the protruding part 26b. In some embodiments, the distance S1 of the space between the package structure PKG1a and the package structure PKG2a is less than the height of the connector 26, and is equal to the height of the protruding part 26b of the connector 26. Therefore, the distance S1 of the space between the package structures PKG1a and PKG1b and the height of the PoP device 100a may be adjusted by controlling the thickness of the film 12. In some embodiments, the distance S1 of the space between the package structure PKG1a and the package structure PKG2a ranges from 50 µm to 250 µm.

The underfill layer 27 includes an extension part 27a and a body part 27b on the extension part 27a. The extension part 27a is filled in the recess 25, and surrounds the embedded part 26a of the connector 26. In some embodiments, the extension part 27a is between the embedded part 26a of the connector 26 and the film 12, and aside the adhesive layer 14, the die 20, and the second portion 21b of the encapsulant 21. The bottom surface of the extension part 27a is level with the bottom surface of the connector 26. The body part 27b is located between the package structure PKG2a and the package structure PKG1a, and surrounds the protruding part 26b of the connector 26. The thickness of the body part 27b is equal to the distance S1, and is less than the height of the connector 26.

Figure 3:
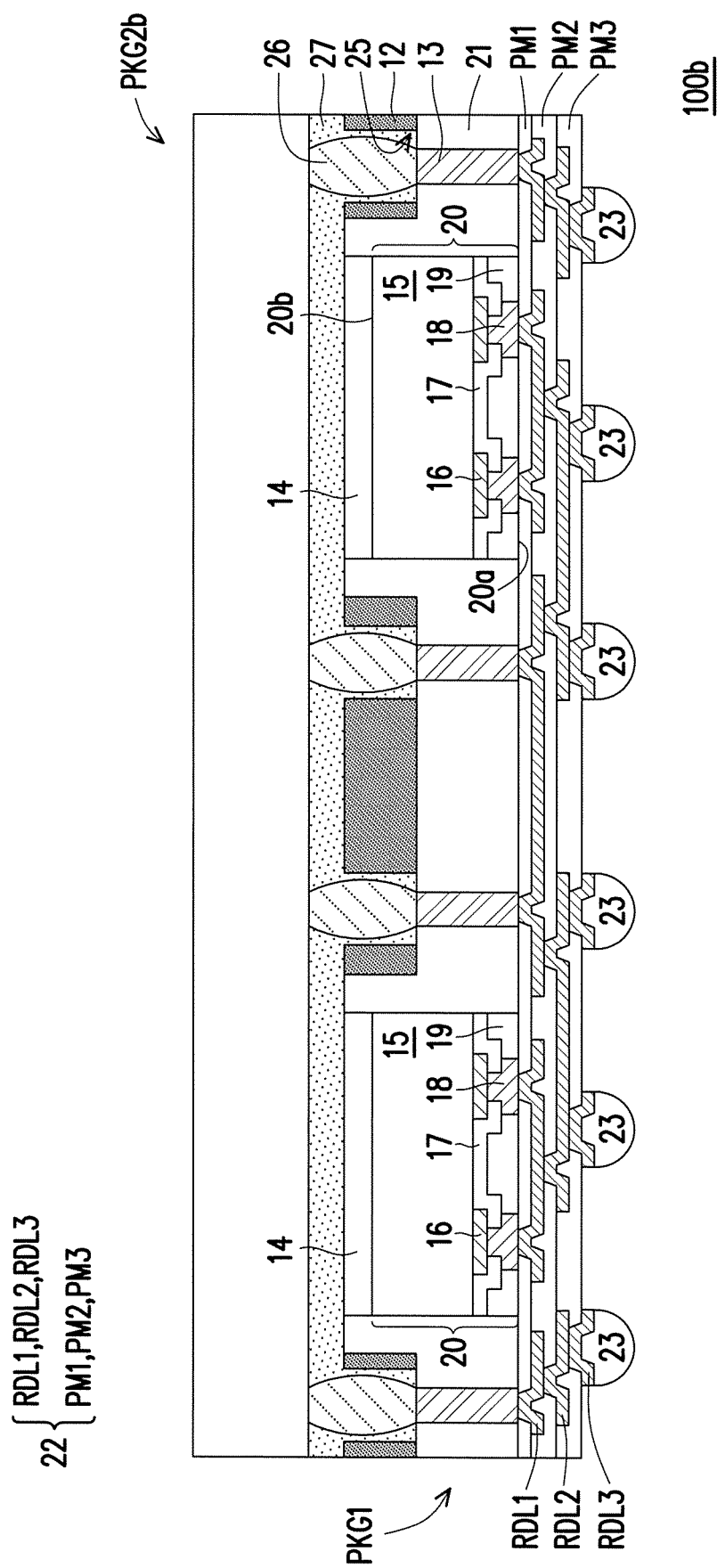
FIG. 3, FIG. 4 and FIG. 5 are examples respectively illustrating a PoP device according to some embodiments of the disclosure.

Referring to FIG. 1F and FIG. 3, in some embodiments in which the package structure PKG1 includes two dies 20, and the two dies 20 are electrically connected to each other through the RDL structure 22, after the recesses 25 are formed in the film 12, processes similar to those of FIG. 1G are performed, and a package structure PKG2b is bonded to the package structure PKG1 through a plurality of connectors 26. The package structure PKG2b may be a device the same as or different from the package structure PKG2a. An underfill layer 27 is disposed to fill the space between the package structure PKG2b and the package structure PKG1, and surround the connectors 26.

Referring to FIG. 3, a PoP device 100b is thus completed. The PoP device 100b includes the package structure PKG1, the package structure PKG2b, the connectors 26 and the underfill layer 27. The package structure PKG1 includes two dies 20. The PoP device 100b differs from the PoP device 100a in that two dies 20 are included in package structure PKG1, and the two dies 20 are electrically connected though the RDL structure 22. The other structural characteristics of the PoP device 100b are substantially the same as those of the PoP device 100a.

FIG. 2A to FIG. 2E illustrate a method of manufacturing a PoP device according to a second embodiment of the disclosure. The second embodiment differs from the first embodiment in that a dielectric layer 30 is further formed before a fillm 12 is formed. The material of the dielectric layer 30 may be the same as or different from the material of the film 12 and the material of the encapsulant 21. The details are described as below.

Figure 2A:
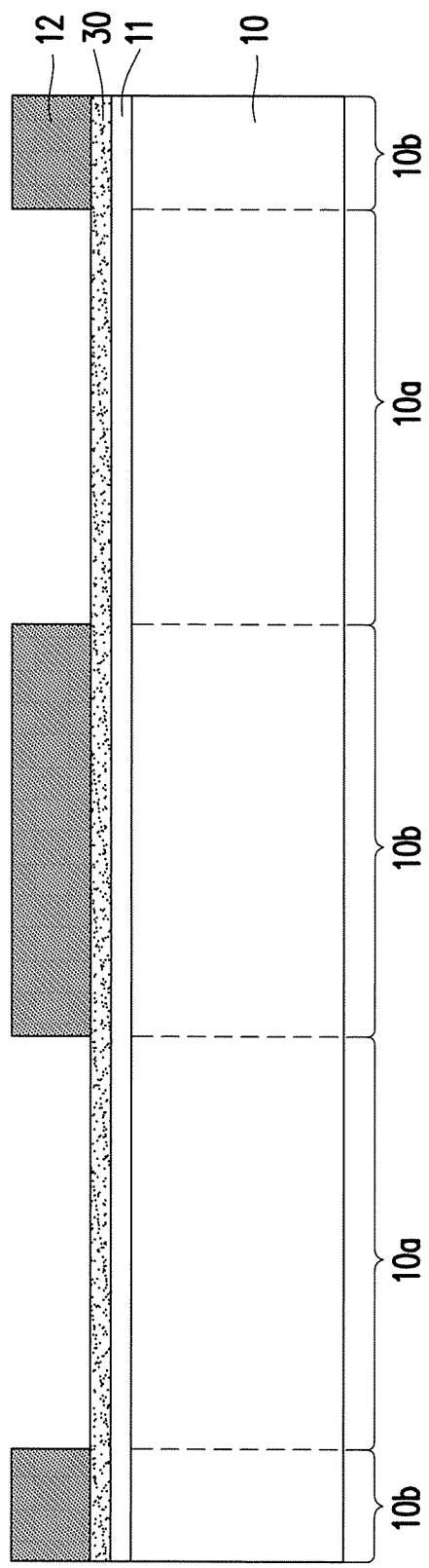
FIG. 2A to FIG. 2E are schematic cross-sectional views illustrating a method of forming a PoP device according to a second embodiment of the disclosure.

Referring to FIG. 1A and FIG. 2A, in some embodiments, after the de-bonding layer 11 is formed on the carrier 10, a dielectric layer 30 is formed on the de-bonding layer 11. In some embodiments, the dielectric layer 30 is a polymer layer. The polymer includes, for example, PI, PBO, BCB, ABF, Solder Resist film (SR), or the like. The dielectric layer 12 is formed by a suitable fabrication technique such as spin-coating, lamination, deposition, or the like. Thereafter, a film 12 is formed over the carrier 10. The material, the forming method and the structural characteristics of the film 12 are substantially the same as those in the first embodiment.

Figure 2B:
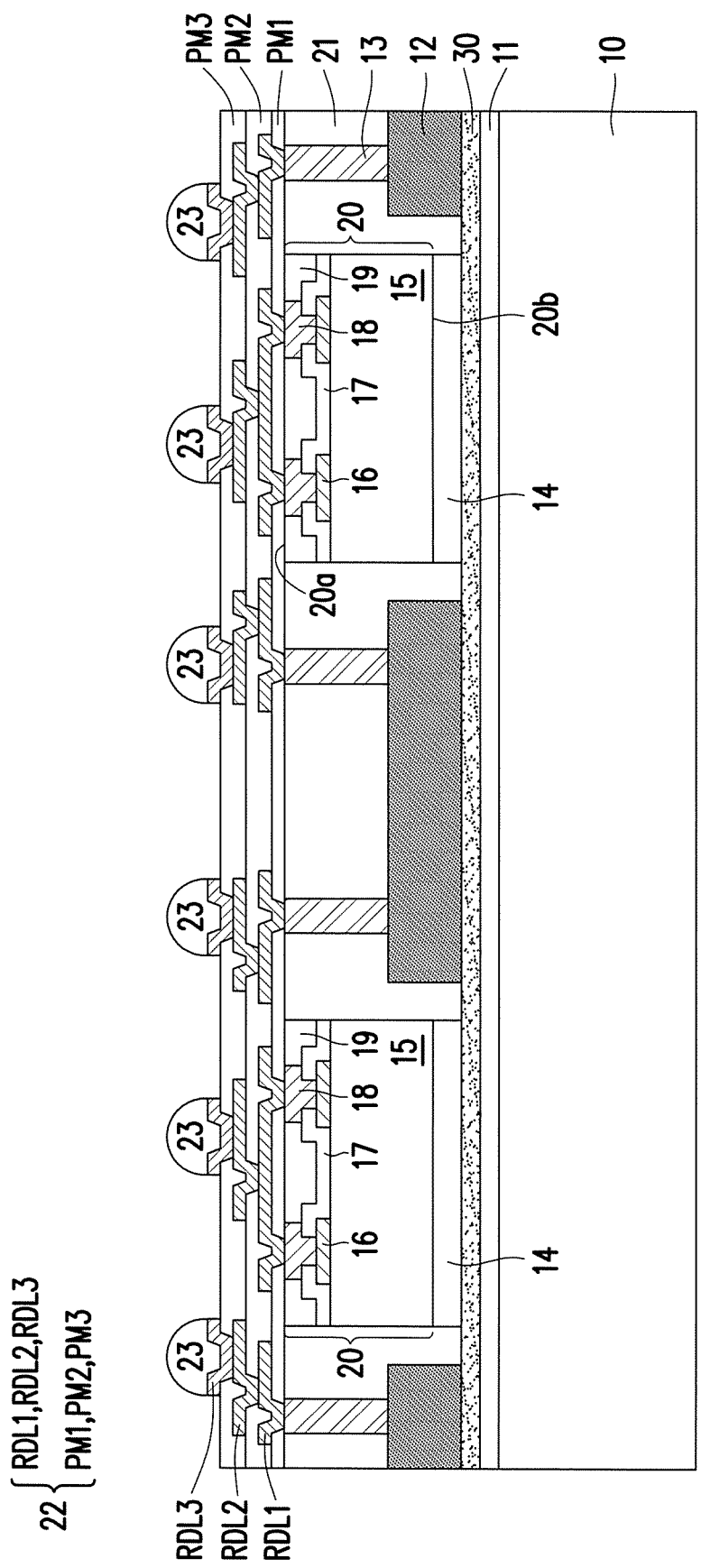

Referring to FIG. 2B, processes similar to those from FIGS. 1B to 1D are performed, and a plurality of TIVs 13 are formed on the film 12. One or more dies 20 are mounted on the carrier 10. An encapsulant 21 is formed to encapsulate sidewalls of the die 20 and sidewalls of the TIVs 13. A plurality of connectors 23 are formed over the dies 20, and are electrically connected to the dies 20 through a RDL structure 22.

Figure 2C:
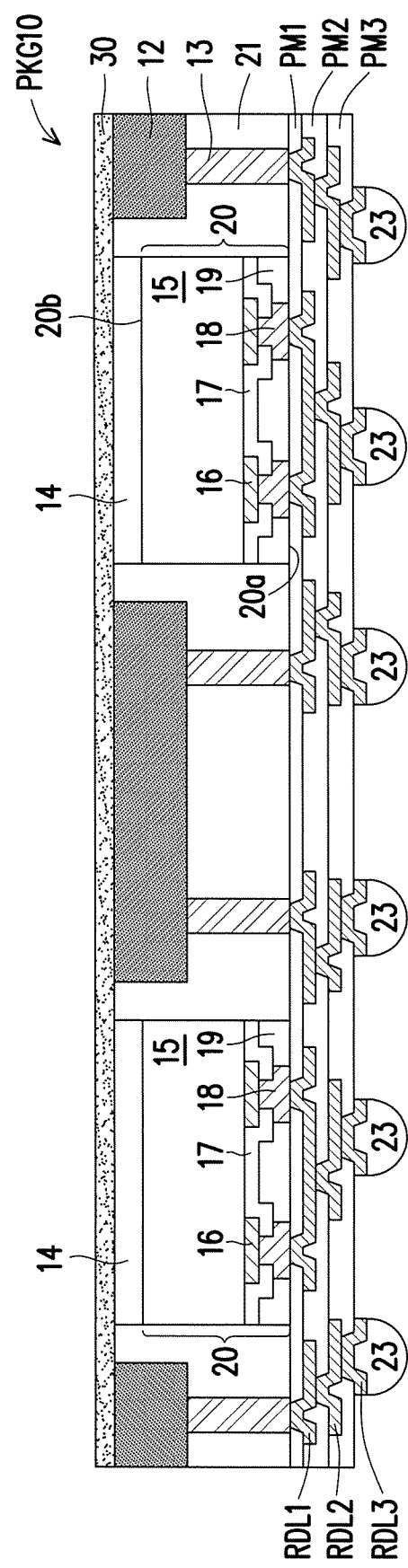

Referring to FIG. 2B and FIG. 2C, processes similar to those from FIG. 1D to FIG. 1E are performed, and the carrier 10 is released from the structure formed in FIG. 2C with the de-bonding layer 11 decomposed. A package structure PKG10 is thus completed.

Referring to FIG. 2C, the package structure PKG10 includes the dielectric layer 30, the dies 20, the film 12, the TIVs 13, the encapsulant 21, the RDL structure 22 and the connectors 23. The second surface 20b of the die 20 is covered by the adhesive layer 14. The top surface of the film 12, the top surface of the encapsulant 21, and the top surface of the adhesive layer 14 are covered by the dielectric layer 30. The top surface of the dielectric layer 30 is exposed. The other structural characteristics of the package structure PKG10 are substantially the same as those of the package structure PKG1, and are not described again.

Figure 2D:
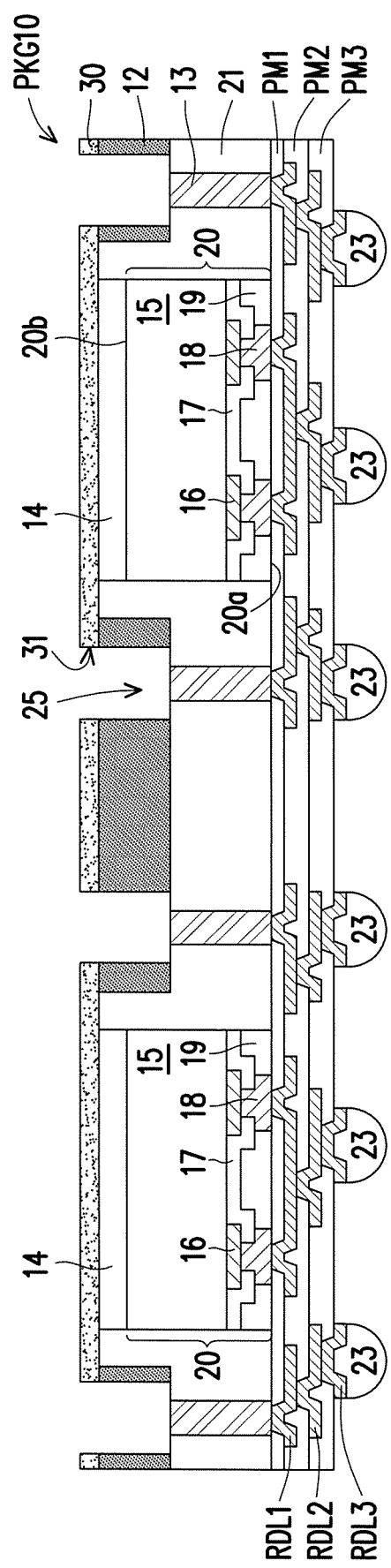

Referring to FIG. 2C and FIG. 2D, a portion of the dielectric layer 30 and a portion of the film 12 underlying the portion of the dielectric layer 30 are removed, so as to form a plurality of openings 31 in the dielectric layer 30, and form a plurality of recesses 25 in the film 12. The removal method includes, for example, laser drilling process. The openings 31 are located over and in spatial communication with the recesses 25. The width and the shape of opening 31 may be the same as or different from the width and the shape of the recess 25. The openings 31 and the recesses 25 at least expose portions of the top surfaces of the TIVs 13. In some embodiments, the top surfaces of the TIVs 13 and a portion of the surface of the encapsulant 21 are exposed by the recess 25 and the opening 31.

Figure 2E:
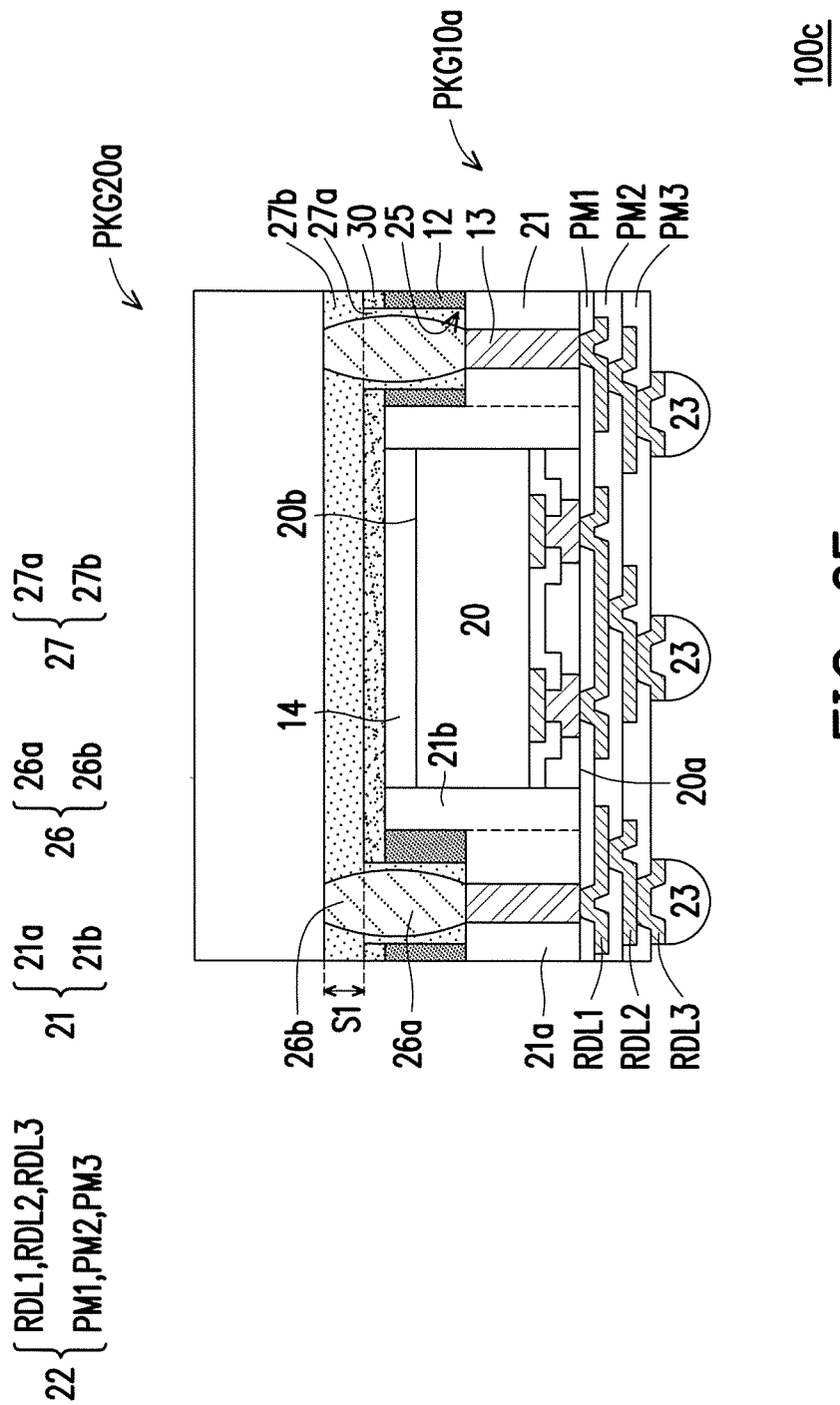

Referring to FIG. 2D and FIG. 2E, in some embodiments, processes similar to those of FIG. 1G and FIG. 1H are performed, one or more package structures PKG20a is/are electrically bonded to the package structure PKG10 though a plurality of connectors 26. The connectors 26 fill into the openings 31 of the dielectric layer 30 and the recesses 25 of the film, and are in electrical contact with the TIVs 13 of the package structure PKG10. In other words, the connectors 26 penetrate through the dielectric layer 30 and the film 12, and are in electrical contact with the top surface of the TIVs 13. An underfill layer 27 is formed to fill the space between the package structure PKG10 and the package structure PKG20a, and surround the connectors 26. In some embodiments in which the dies 20 are electrically isolated, a die-saw process is further performed. The package structure PKG10 is singulated, and a package structure PKG10a is formed.

Referring to FIG. 2E, A PoP device 100c is formed. The PoP device 100c includes the package structure PKG10a, the package structure PKG20a, the connectors 26, and the underfill layer 27. The PoP device 100c differs from the PoP device 100a in that a dielectric layer 30 is included in the package structure PKG10. The details are described as below.

In some embodiments, the dielectric layer 30 is located between the underfill layer 27 and the film 12, between the underfill layer 27 and the encapsulant 21, and between the underfill layer 27 and the adhesive layer 14. The bottom surface of dielectric layer 30 is higher than the bottom surface of the connector 26 and the top surface of the TIV 13. The dielectric layer 30 is separated from the TIV 13 by the film 12, and is separated from the connector 26 by the underfill layer 27 therebetween. In other words, the dielectric layer 30 is not in contact with the TIV 13 and the connector 26.

The encapsulant 21 includes a first portion 21a and a second portion 21b connected to each other. The first portion 21a is not in contact with the dielectric layer 30, and is separated from the dielectric layer 30 by the film 12 therebetweem. The second portion 21b is in contact with the dielectric layer 30.

Except for the dielectric layer 30 is included in the package structure PKG10, the other structural characteristics of the PoP device 100c are substantially the same as those of the PoP device 100a (FIG. 1H), and is not described again.

Figure 4:
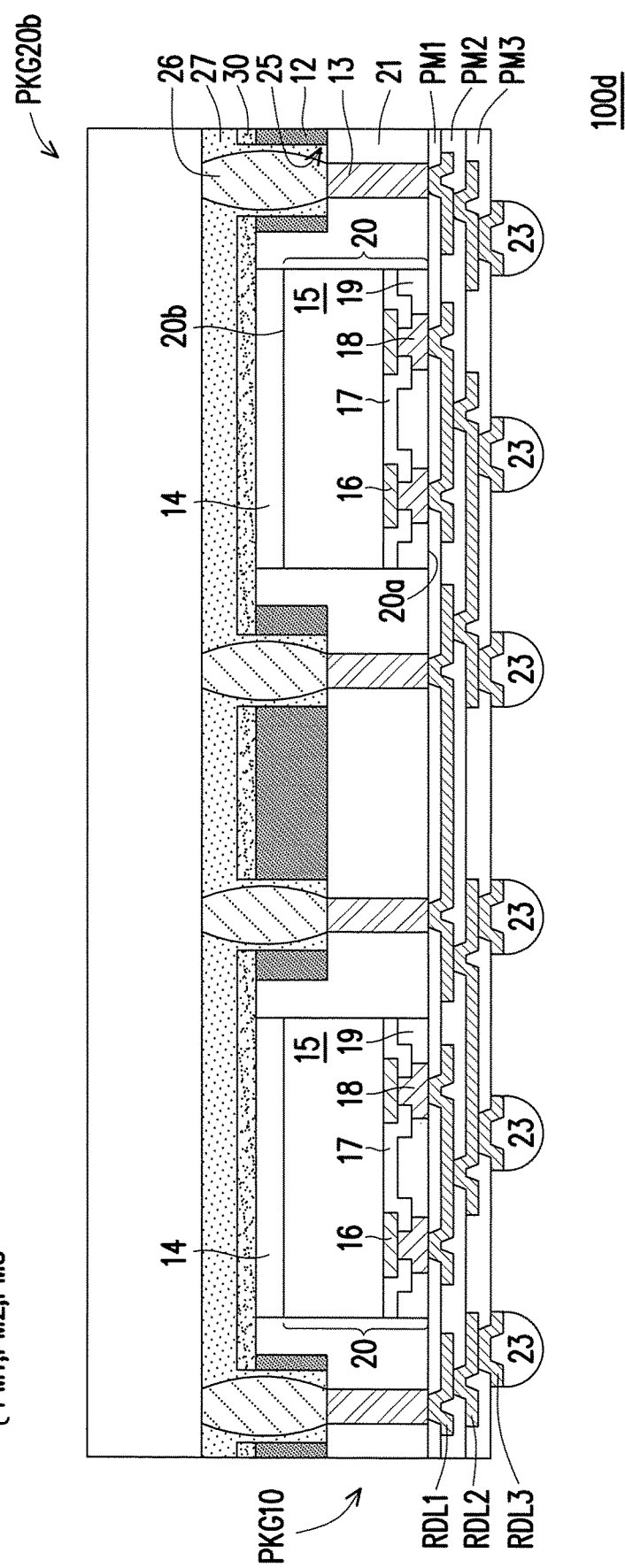

Referring to FIG. 4, in some embodiments in which the package structure PKG10 includes two dies 20, and the two dies 20 are electrically connected through the RDL structure 22, after the openings 31 and the recesses 25 are formed as shown in FIG. 2D, processes similar to those from FIG. IF to FIG. 3 are performed, a package structure PKG20b is bonded to the package structure PKG10 through a plurality of connectors 26. An underfill layer 27 is formed to fill the space between the package structure PKG10 and the package structure PKG20b, and surround the connectors 26. A PoP device 100d is thus completed. The PoP device 100d differs from the PoP device 100b in that the dielectric layer 30 is included in the package structure PKG10, the other structural characteristics of the PoP device 100d are substantially the same as those of the PoP device 100c.

Figure 5:
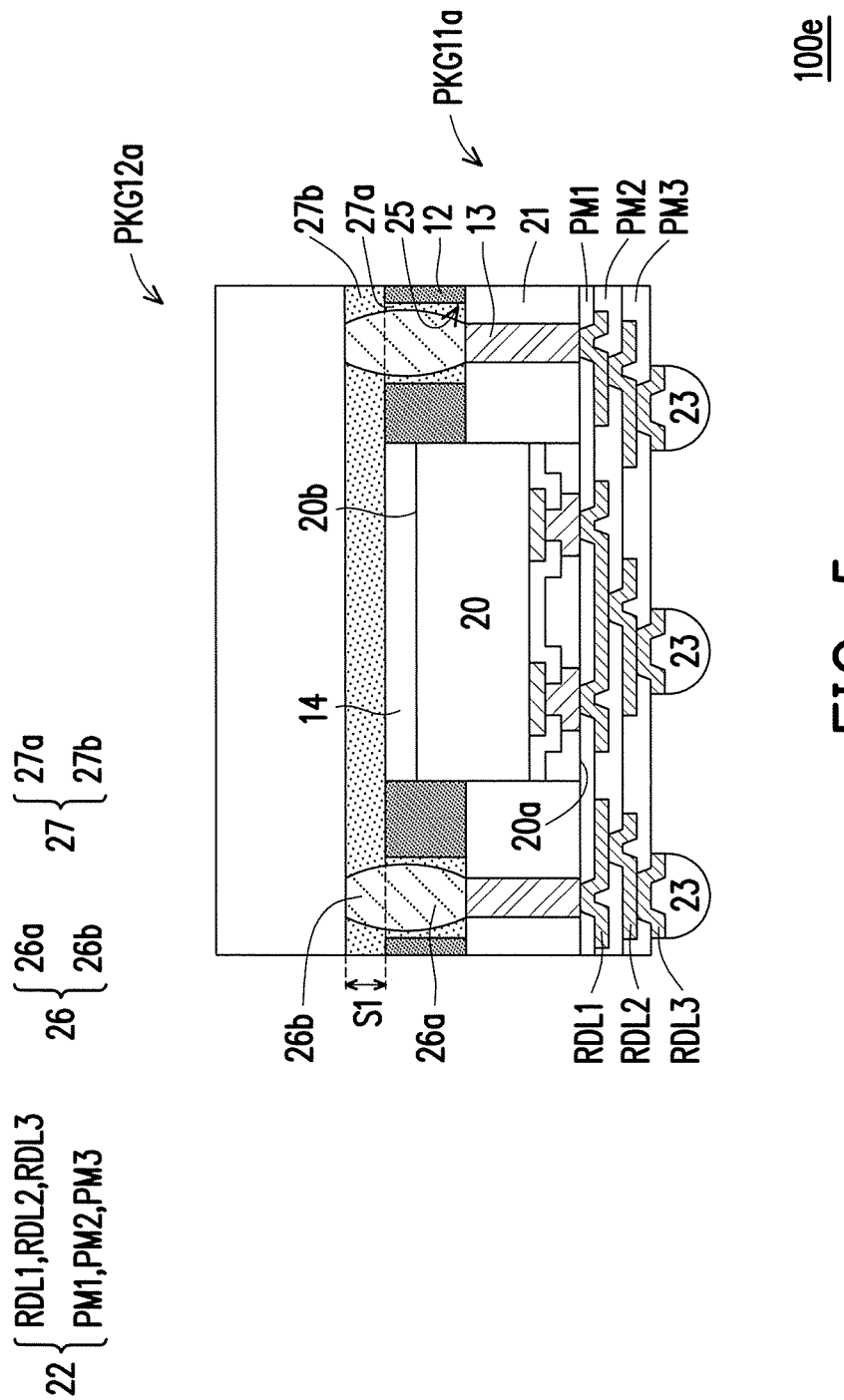

In the embodiments described above, the film 12 is not in contact with the die 20 or the adhesive layer 14, but separated from the die 20 and the adhesive layer 14 by the encapsulant 21 therebetween. (FIGS. 1H, 2E, 3, 4) However, the disclosure is not limited thereto. FIG. 5 is an example of a PoP device according to some other embodiments of the disclosure.

Referring to FIG. 5, a PoP device 100e includes a package structure PKG11a and a package structure PKG12a. The PoP device 100e shown in FIG. 5 differs from the PoP device 100a shown in FIG. 1H in that, the film 12 of the package structure PKG11a is formed to be in contact with portions of the sidewalls of the die 20 and sidewalls of the adhesive layer 14. In this embodiment, the top surface of the encapsulant 21 is at a same plane, that is, the encapsulant 21 does not have a stepped structure. The top surface of the encapsulant is covered by the film 12 and the underfill layer 27, and is lower than the top surface of the adhesive layer 14, and the second surface 20b of the die 20. The encapsulant 21 encapsulates sidewalls of the TIVs 13 and the other portions of the sidewalls of the die 20. In other words, the sidewalls of the die 20 are covered by the film 12 and the encapsulant 21. The other structural characteristics of the PoP device 100e are substantially the same as those of the PoP device 100a shown in FIG. 1H. It is mentioned that, in the second embodiments in which the dielectric layer 30 is formed, the film 12 may also extend to be in contact with the sidewalls of the die 20 and the sidewalls of the adhesive layer 14 (not shown).

Figure 7:
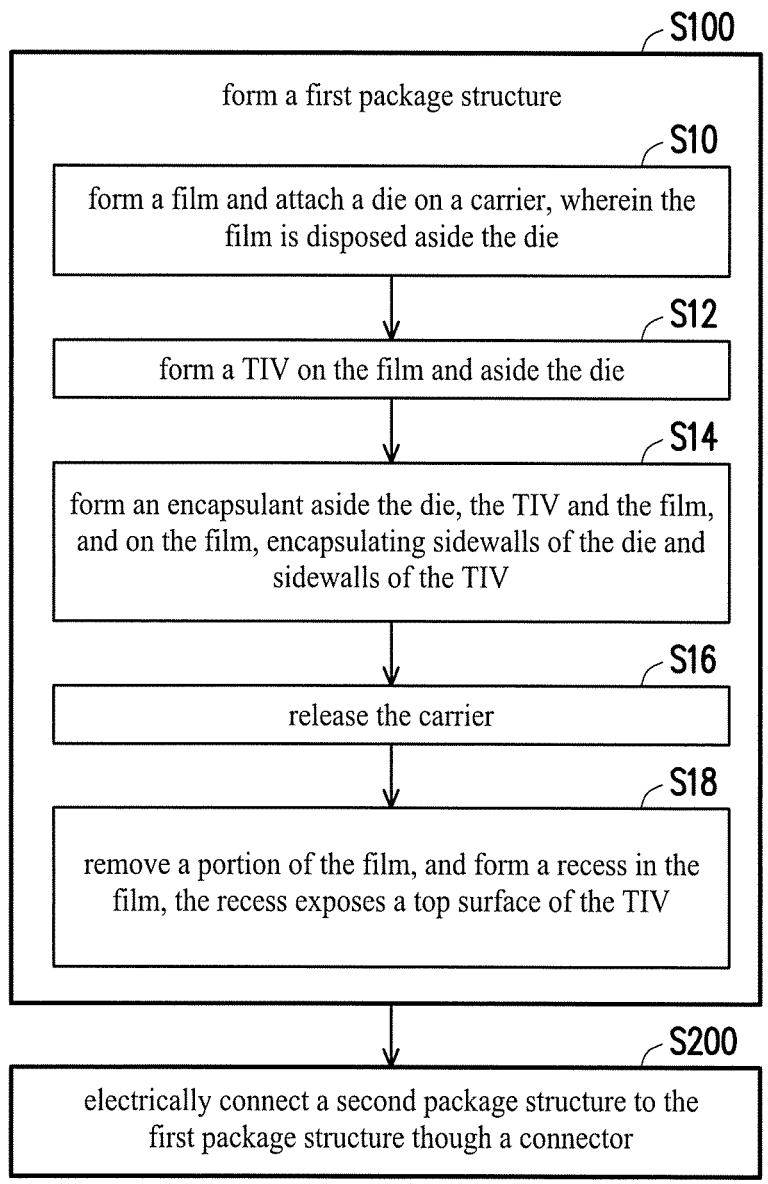
FIG. 7 is a flow chart of a method of forming a PoP device according to some embodiments of the disclosure.

FIG. 7 is a flow chart of a method of manufacturing a PoP device according to some embodiments of the disclosure. Referring to FIG. 7, in step S100, a fist package structure is formed by the following steps. In step S10, a film is formed and a die is attached on a carrier. The film is disposed aside the die. In step S12, a TIV is formed on the film and aside the die. In step S14, an encapsulant is formed aside the die, the TIV and the film, and on the film. The encapsulant encapsulates sidewalls of the die and sidewalls of the TIV. In step S16, the carrier is released. In step S18, a portion of the film is removed, and a recess is formed in the film. The recess exposes a top surface of the TIV. Thereafter, in step S200, a second package structure is electrically connected to the first package structure though a connector.

In the embodiments of the disclosure, a film is formed on the carrier before the TIV is formed, and the TIV is then formed on the film over the carrier. Before the connector bonding the two package structures is formed, a recess is formed in the film, and the connector is then filled in the recess of the film. Therefore, the distance between the two package structures is reduced, the height (or referred as thickness) of the PoP device is thus reduced, and is easily tunable by controlling the thickness of the film.

In some embodiments, the thickness of the die is required to be thick, so as to achieve a better heat dissipation performance. In this case, even if the thickness of the die is increased, the thickness of the whole PoP device is not increased, but may keep the same, or even decreased.

In accordance with some embodiments of the disclosure, a PoP device includes a first package structure and a second package structure. The first package structure includes a die, a TIV, an encapsulant, and a film. The TIV is aside the die. The encapsulant encapsulates sidewalls of the die and sidewalls of the TIV. The film is over the TIV and the encapsulant, and aside the die. The second package structure is connected to the first package structure through a connector. The connector penetrates through the film to electrically connected to the TIV.

In accordance with alternative embodiments of the disclosure, a PoP device includes a first package structure and a second package structure. The first package structure includes a die, a TIV, an encapsulant and a conductive terminal. The TIV is aside the die. The encapsulant is aside the die and the TIV, encapsulating sidewalls of the die and sidewalls of the TIV. The conductive terminal is electrically connected to the die and the TIV through a RDL structure. The second package structure is electrically connected to the first package structure through a connector. The connector is in electrical contact with a top surface of the TIV. A portion of the connector is aside the die. A bottom surface of the connector is lower than a top surface of the die.

In accordance with some embodiments of the disclosure, a method of manufacturing a PoP device includes the following steps. A first package structure is formed as below. A film is formed on a carrier, and a die is attached on the carrier. The film is disposed aside the die. A TIV is formed on the film and aside the die. An encapsualnt is formed aside the die, the TIV and the film, and on the film, encapsulating sidewalls of the die and sidewalls of the TIV. The carrier is released. A portion of the film is removed. A recess is formed in the film. The recess exposes a top surface of the TIV. A second package structure is electrically connected to the first package structure though a connector. The connector fills in the recess of the film to be in electrical contact with the TIV.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package-on-package (PoP) device, comprising:
   a first package structure, comprising:
     a die;
     a through integrated fan-out via (TIV) aside the die;
     an encapsulant encapsulating sidewalls of the die and sidewalls of the TIV; and
     a film over the TIV and the encapsulant, and aside the die; and
   a second package structure, connected to the first package structure through a connector,
   wherein the connector penetrates through the film to electrically connect to the TIV,
   wherein the film is surrounded by the encapsulant, and a top surface of the film is coplanar with a top surface of the encapsulant.

2. The PoP device of claim 1, further comprising an underfill layer, disposed to fill a space between the first package structure and the second package structure, and surround the connector, wherein a portion of the underfill layer is between the connector and the film, and aside the die.

3. The PoP device of claim 2, wherein the first package structure further comprising an adhesive layer disposed between the die and the underfill layer.

4. The PoP device of claim 3, wherein a top surface of the TIV and a bottom surface of the connector are lower than a top surface of the adhesive layer, and lower than a top surface of the die.

5. The PoP device of claim 4, wherein the top surface of the film, the top surface of the encapsulant, and the top surface of the adhesive layer are coplanar with each other.

6. The PoP device of claim 3, wherein the first package stricture further comprising a dielectric layer, disposed between the underfill layer and the adhesive layer, between the underfill layer and the encapsulant, and between the underfill layer and the film, wherein the connector further penetrates through the dielectric layer on the film.

7. The PoP device of claim 6, wherein a portion of the encapsulant is separated from the dielectric layer by the film therebetween.

8. The PoP device of claim 1, wherein
   the encapsulant has a stepped structure comprising a first portion and a second portion connected to each other;
   the first portion encapsulates sidewalls of the TIV, the second portion is between the first portion and the die and encapsulates sidewalls of the die;
   a top surface of the first portion is lower than a top surface of the second portion; and
   the film is located over the first portion and aside the second portion of the encapsulant.

9. The PoP device of claim 1, wherein the first package structure further comprises a conductive terminal, electrically connected to the die though a redistribution layer (RDL) structure.

10. A PoP device, comprising:
    a first package structure, comprising:
      a die;
      a TIV aside the die;
      an encapsulant aside the die and the TIV, encapsulating sidewalls of the die and sidewalls of the TIV;
      a film, over the TIV and aside the die, and surrounded by the encapsulant, and a top surface of the film is coplanar with a top surface of the encapsulant; and
      a conductive terminal, electrically connected to the die and the TIV through a redistribution layer (RDL) structure; and
    a second package structure electrically connected to the first package structure though a connector, wherein the connector penetrates through the film to be in electrical contact with a top surface of the TIV,
    wherein a portion of the connector is aside the die, and a bottom surface of the connector is lower than a top surface of the die.

11. The PoP device of claim 10, further comprising an underfill layer, disposed to fill a space between the first package structure and the second package structure, and surround the connector, wherein a portion of the underfill layer is located aside the die.

12. The PoP device of claim 11, wherein the first package structure further comprises a dielectric layer disposed between the underfill layer and the die, and between the underfill layer and the encapsulant.

13. The PoP device of claim 12, wherein the connector is penetrating through the dielectric layer.

14. The PoP device of claim 13, wherein a bottom surface of the dielectric layer is higher than the bottom surface of the connector.

15. A method of manufacturing a PoP device, comprising:
    forming a first package structure, comprising:
      forming a film and attaching a die on a carrier, wherein the film is disposed aside the die;
      forming a TIV on the film and aside the die;
      forming an encapsulant aside the die, the TIV and the film, and on the film, encapsulating sidewalls of the die and sidewalls of the TIV;
      releasing the carrier; and
      removing a portion of the film, and forming a recess in the film, the recess exposes a top surface of the TIV; and
    electrically connecting a second package structure to the first package structure though a connector,
    wherein the connector fills in the recess of the film to be in electrical contact with the TIV,
    wherein the film is surrounded by the encapsulant, and a top surface of the film is coplanar with a top surface of the encapsulant.

16. The method of claim 15, further comprises forming an underfill layer, disposed to fill a space between the first package structure and the second package structure, and fill in the recess of the film to surround the connector.

17. The method of claim 16, wherein forming the first package structure further comprises forming a dielectric layer on the carrier before the film is formed and the die is attached.

18. The method of claim 17, wherein before removing a portion of the film, further comprises removing a portion of the dielectric layer, so as to form an opening in the dielectric layer, and the opening is located over the recess of the film.

19. The method of claim 18, wherein the connector and the underfill layer further fills in the opening of the dielectric layer.

20. The method of claim 15, wherein before the carrier is released, forming the first package structure further comprises:
    forming a redistribution layer (RDL) structure on the die, the encapsulant and the TIV; and forming a conductive terminal on the RDL structure, wherein the conductive terminal electrically connects to the die through the RDL structure.

\* \* \* \* \*